United States Patent
Wijetunga et al.

(10) Patent No.: US 11,900,985 B1
(45) Date of Patent: Feb. 13, 2024

(54) CLOCKING ARCHITECTURE SUPPORTING MULTIPLE DATA RATES AND REFERENCE EDGE SELECTION

(71) Applicant: Rambus Inc., San Jose, CA (US)

(72) Inventors: Panduka Wijetunga, Thousand Oaks, CA (US); Abhishek Desai, Newbury Park, CA (US)

(73) Assignee: RAMBUS INC., San Jose, CA (US)

( * ) Notice: Subject to any disclaimer, the term of this patent is extended or adjusted under 35 U.S.C. 154(b) by 205 days.

(21) Appl. No.: 17/405,527

(22) Filed: Aug. 18, 2021

Related U.S. Application Data

(60) Provisional application No. 63/126,489, filed on Dec. 16, 2020, provisional application No. 63/074,863, filed on Sep. 4, 2020.

(51) Int. Cl.
| | | |
|---|---|---|
| *G11C 11/4076* | (2006.01) | |
| *G06F 1/06* | (2006.01) | |
| *H03K 3/017* | (2006.01) | |

(52) U.S. Cl.
CPC ............ *G11C 11/4076* (2013.01); *G06F 1/06* (2013.01); *H03K 3/017* (2013.01)

(58) Field of Classification Search
CPC ........ G11C 11/4076; G06F 1/06; H03K 3/017
See application file for complete search history.

(56) References Cited

U.S. PATENT DOCUMENTS

| | | | | |
|---|---|---|---|---|
| 6,643,787 | B1 * | 11/2003 | Zerbe .................... | G06F 13/364 |
| | | | | 713/400 |
| 10,129,012 | B2 * | 11/2018 | Dhakshinamurthy ...................... | |
| | | | | H04L 7/0037 |
| 2019/0043541 | A1 * | 2/2019 | Takefman ............ | G11C 7/1066 |
| 2021/0327489 | A1 * | 10/2021 | O ........................ | G11C 11/4078 |

* cited by examiner

*Primary Examiner* — Ajay Ojha
(74) *Attorney, Agent, or Firm* — Amsel IP Law PLLC; Jason Amsel

(57) ABSTRACT

A clocking architecture for a memory module is configurable to independently select either rising or falling edges of an input clock as respective references for generation of an internal clock and an output clock. The clocking architecture supports reference edge selection in both a single data rate (SDR) mode and a double data rate (DDR) mode while maintaining a fixed phase relationship between the input clock and the output clock regardless of the reference edge selection.

20 Claims, 6 Drawing Sheets

CLOCKING ARCHITECTURE SUPPORTING MULTIPLE DATA RATES AND REFERENCE EDGE SELECTION

CROSS-REFERENCE TO RELATED APPLICATIONS

This application claims the benefit of U.S. Provisional Patent Application No. 63/074,863 filed on Sep. 4, 2020 and U.S. Provisional Patent Application No. 63/126,489 filed on Dec. 16, 2020, which are each incorporated by reference herein.

BACKGROUND

In electronic devices such as memory modules, clock noise can have a significant impact on performance. However, managing clock noise is a challenging problem especially in high speed devices that support multiple data rates and have strict timing requirements.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

A clocking architecture for a memory module is configurable to independently select either rising or falling edges of an input clock as respective references for generation of an internal clock and an output clock. The clocking architecture supports reference edge selection in both a single data rate (SDR) mode and a double data rate (DDR) mode while maintaining a fixed phase relationship between the input clock and the output clock regardless of the reference edge selection. Control signals enable configuration of the data rate mode and the reference edge selections to optimize performance under varying noise conditions.

Figure 1:
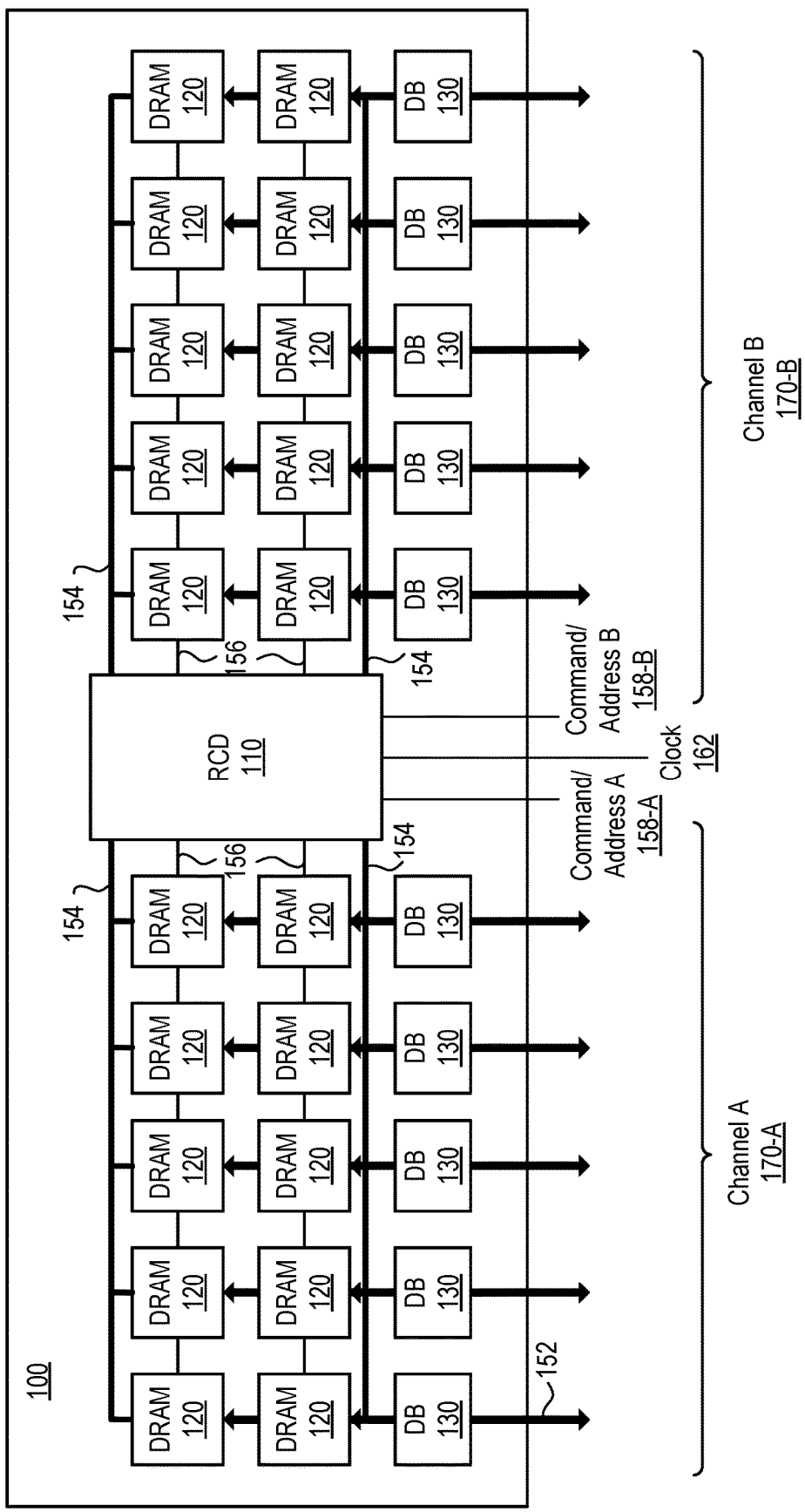
FIG. 1 is a block diagram illustrating an example embodiment of a memory module.

FIG. 1 illustrates an embodiment of a memory module 100. The memory module 100 includes an array of memory devices 120 (e.g., DRAM devices), a set of data buffers 130, and a registered clock driver (RCD) 110. The memory module 100 supports data channels (e.g., channel A 170-A and channel B 170-B) for communicating data to and from the memory module 100 via a data interface 152. When receiving data during a write operation, the data buffers 130 buffer and route the data to an appropriate memory device 120. When sending data during a read operation, the data buffers 130 buffer and route data from the appropriate memory device 120 to the data interface 152. The data buffers 130 may be optionally omitted. If the data buffers 130 are not present, a controller may directly interface with the array of memory devices 120.

The RCD 110 comprises a buffer circuit that receives an input clock 162 and command/address signals 158 (e.g., 158-A, 158-B) for the respective data channels 170. The RCD 110 recovers an internal clock signal based on the input clock 162 and samples the command/address signals 158 to recover digital data. The RCD 110 routes recovered digital data to the appropriate memory devices 120 via the command/address buses 156. The RCD 110 furthermore buffers the input clock 162 and generates an output clock that is provided on the clock lines 154 and is aligned to the digital data on the command/address buses 156. The RCD 110 generates the output clock on the clock lines 154 to have an approximately fixed phase relationship to the input clock 162, characterized by the propagation delay through the RCD 110.

The RCD 110 is configurable to operate the memory module 100 in a single data rate (SDR) mode or a double data rate (DDR) mode. In the SDR mode, the incoming data bits of the command/address signals 158 are referenced to the rising edges of the input clock 162. There is typically a ½ cycle offset between the input clock 162 and the input data, resulting in the input data transitions being aligned to the falling edges of the input clock 162. In this mode, a propagation delay tppm-sDR is defined as a delay between a rising edge of the input clock 162 and a corresponding change in output on the command/address buses 156, which is approximately aligned with falling edge of the output clock on the clock lines 154.

In the DDR mode, the incoming data bits of the command/address signals 158 are referenced to both the rising and the falling edges of the input clock 162. There is typically a ¼ cycle offset between the input clock 162 and the input data, resulting in the input data transitions being approximately aligned with the centers of the clock edges. In this mode, a propagation delay tPDM-DDR is defined as a delay between a falling edge of the input clock 162 and a corresponding change in output on the command/address buses 156, which is approximately aligned with a falling edge of the output clock on the clock lines 154.

The RCD 110 is configurable to select the reference edges (rising or falling edges) used for generating the internal clock and the output clock. The reference edges may be selected independently for generation of the internal clock and the output clock. Furthermore, the RCD 110 maintains the propagation delays tPDM-SDR, tpDM-DDR in each of the SDR and DDR modes regardless of the selected reference edges, as will be described in further detail below.

Figure 2:
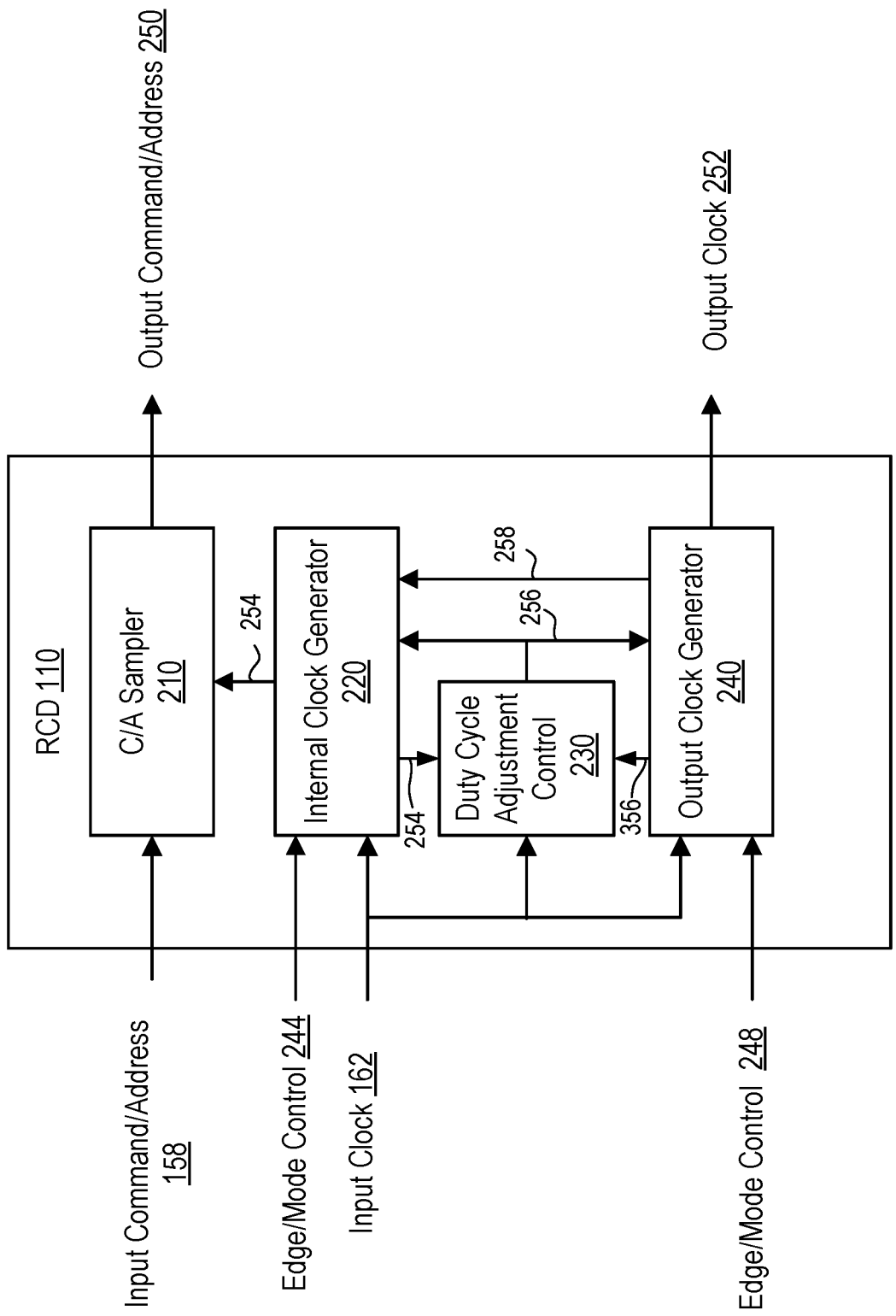
FIG. 2 is a block diagram illustrating an example embodiment of registered clock driver for a memory module.

FIG. 2 illustrates an example embodiment of a clocking architecture for an RCD 110. The RCD 110 includes a command/address sampler circuit 210, an internal clock generator circuit 220, a duty cycle adjustment control circuit 230, and an output clock generator circuit 240. The output clock generator circuit 240 receives the input clock 162 and generates an output clock 252. The edge/mode control signal 248 controls alignment parameters associated with the generation of the output clock 252. For example, the edge/mode control signal 248 controls the data rate mode and whether the rising edge or falling edge of the input clock 162 is used as a reference to generate the output clock 252, while maintaining a fixed phase relationship between the output clock 252 and input clock 162 regardless of the reference edge. The output clock generator circuit 240 also generates an intermediate clock signal 258 used by the internal clock generator circuit 220 to generate the internal clock 254.

The internal clock generator circuit 220 receives the input clock 162 and the intermediate clock 258 and generates the internal clock 254. The edge/mode control signal 244 controls whether the rising or falling edge of the input clock 162 is used as a reference to generate the internal clock 254. The edge/mode control signal 244 may control the reference edge used by the internal clock generator circuit 220 independently of the edge/mode control signal 248 applied to the output clock generator circuit 240 such that the internal clock 254 and output clock 252 may be referenced to different edges of the input clock 162.

The command/address sampler circuit 210 samples the input command/address signal 158 based on timing of the internal clock 254 to generate an output command/address signal 250 representing the sampled digital data provided to the memory devices 120 via the command/address buses 156. The output command/address signal 250 is aligned to falling edges of the output clock 252.

The duty cycle adjustment control circuit 230 receives the internal clock 254 and a feedback clock 356 (described below), detects duty cycle distortion in the input clock signal 162 and generates a duty cycle adjustment signal 256 to the internal clock generator circuit 220 and the output clock generator circuit 240 to compensate for the duty cycle distortion. For example, the duty cycle adjustment control circuit 230 provides control parameters to control the internal clock 254 and the output clock 252 to operate with approximately 50% duty cycle regardless of the duty cycle of the input clock 162. Alternatively, the duty cycle adjustment control circuit 230 may provide control parameters that control the internal clock 254 and output clock 252 to track the duty cycle of the input clock 162.

Figure 3:
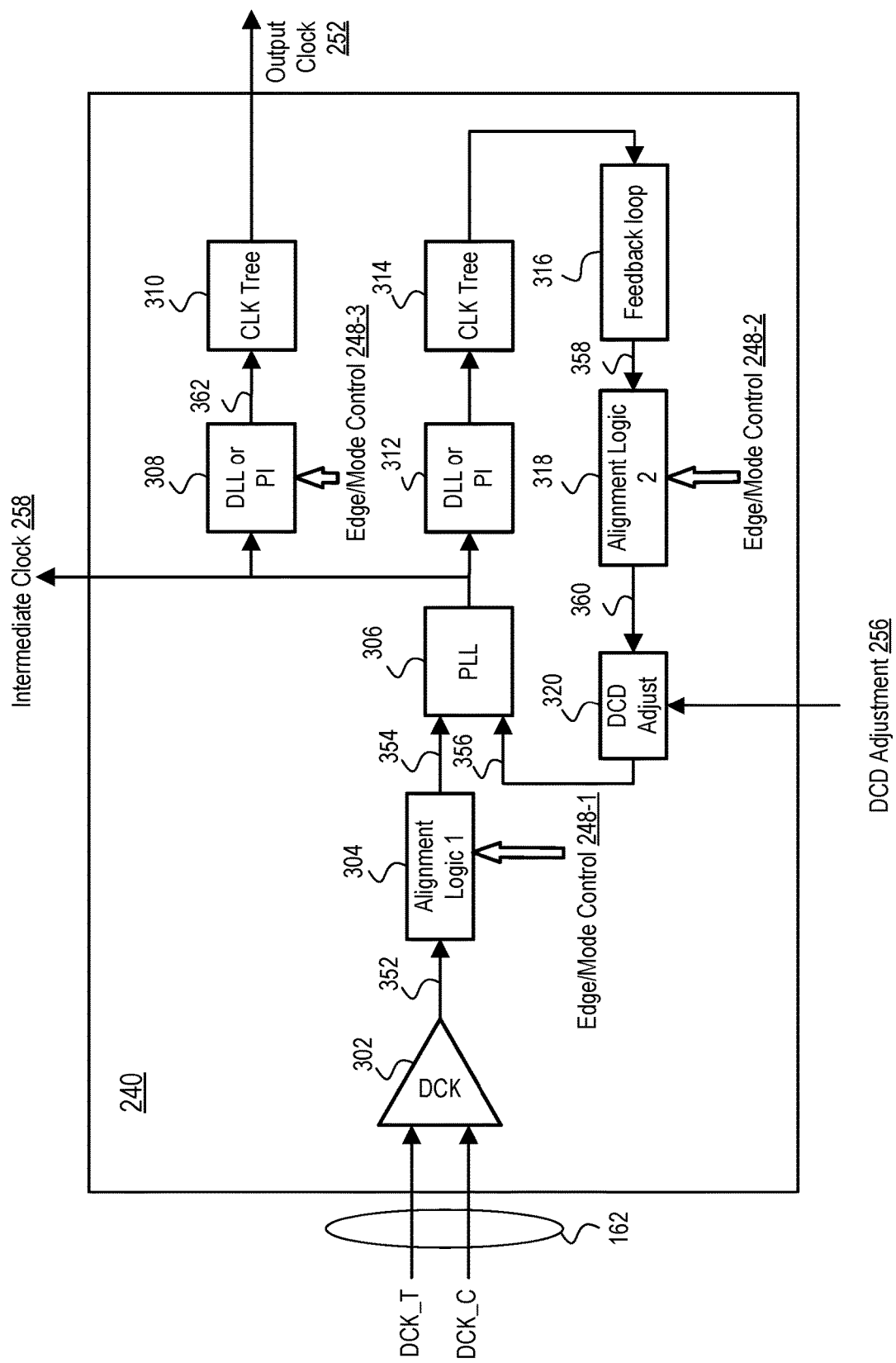
FIG. 3 is a block diagram illustrating an example embodiment of an output clock generator circuit.

FIG. 3 illustrates a detailed block diagram of the output clock generator circuit 240. The output clock generator circuit 240 receives the input clock 162 as a differential clock signal (including components DCK_T, DCK_C). A buffer 302 generates a single-ended input clock signal 352 that is provided to first alignment logic 304. Dependent on the edge/mode control signal 248-1, the alignment logic 304 selectively inverts the clock signal 352 or directly passes through the clock signal 352 (without inverting) to generate a phase-locked loop (PLL) reference clock 354 to a PLL 306 that generates an intermediate clock 258. For example, the edge/mode control signal 248-1 may cause the PLL 306 to lock the intermediate clock 258 to rising edges of the input clock 162 by controlling the alignment logic 304 to output a non-inverted reference clock 354. Alternatively, the edge/mode control signal 248 may cause the PLL 306 to lock the intermediate clock 258 to falling edges of the input clock 162 by controlling the alignment logic 304 to output an inverted reference clock 354.

The PLL 306 compares a phase of a feedback clock 356 to a phase of the PLL reference clock 354 and adjusts a phase of the intermediate clock signal 258 to align the phases of the feedback clock 356 to the reference clock 354. A delay locked loop (DLL)/phase interpolator (PI) circuit 312 may apply a signal delay to meet certain timing requirements (e.g., setting tPDM-SDR or tPDM-DDR depending on the mode of operation). The clock tree circuit 314 and feedback loop 316 further buffer the intermediate clock signal 258 to generate a buffered clock signal 358. Dependent on a second edge/mode control signal 248-2, second alignment logic 318 selectively inverts the buffered clock 358 or directly passes through the buffered clock signal 358 (without inverting) to generate an aligned clock 360. The DCD adjust circuit 320 may adjust the duty cycle of the aligned clock 360 based on the DCD adjustment signal 256 to correct for duty cycle distortion and generate the feedback clock 356 (e.g., to maintain a 50% duty cycle or match the input duty cycle of the input clock 162). The second alignment logic 318 controls whether rising or falling edges of the intermediate clock 258 are used as feedback reference edges to the PLL 306. Inverting the feedback clock 356 by the second alignment logic 318 effectively causes a 180 degree phase shift in the intermediate clock 258 relative to the PLL reference clock 354.

The intermediate clock 258 is also provided to an output DLL (or PI) 308 that may optionally apply a 180 degree phase shift dependent on a third edge/mode control signal 248-3 to generate a DLL output signal 362. The clock tree 310 then buffers the DLL output signal 362 to generate the output clock 252.

The edge/mode control signals 248 collectively operate to control an operating mode of the output clock generator circuit 240. The operating mode can be configured for either SDR or DDR operation, can enable the PLL 306 to utilize either the rising or falling edge of the input clock 162 as an PLL input reference, and can enable the PLL 306 to utilize either the rising or falling edge of the intermediate clock 258 as a feedback reference edge. Furthermore, in either the SDR or DDR modes, a 180 degree phase shift may selectively be applied to maintain a fixed phase relationship between the input clock 162 and the output clock 252 regardless of the reference edge selections.

For example, in an SDR/rising edge alignment mode, the edge/mode control signal 248-1 configures the first alignment logic 304 to directly pass the input clock signal 352 without inverting it. In this configuration, the PLL 306 locks to the rising edge of the input clock 162 and any noise on the falling edge of the input clock 162 does not affect the signal. The second alignment logic 318 may select between using the rising edge or falling edge of the intermediate clock 258 as a feedback reference edge. If the second alignment logic 318 selects the falling edge of the intermediate clock 258, it inverts the feedback clock 356, which causes a 180 degree phase shift in the intermediate clock 258 relative to the PLL reference clock 354. The output DLL (or PI) 308 may be configured to apply an additional 180 degree phase shift to compensate. If the second alignment logic 318 selects the rising edge of the intermediate clock 258 as the reference feedback edge, the output DLL (or PI) 308 does not apply the 180 degree phase shift. The output clock 252 therefore has rising edges with an approximately fixed phase relationship to rising edges of the input clock 162, characterized by the propagation delay from the input clock 162 to the output clock 252. Changes in the output command/address data 250 are aligned to falling edges of the output clock 252 in SDR mode, and the SDR propagation delay between the rising edge of the input clock 162 and the change in the output command/address data 250 (on a corresponding falling edge of the output clock 252) may be defined as $t_{PDM\text{-}SDR}$.

In an SDR/falling edge alignment mode, the edge/mode control signal 248 configures the first alignment logic 304 to invert the PLL reference clock 354 so that DLL (or PI) 406 locks to the falling edges of the input clock 162, and any noise on the rising edge of the input clock 162 does not affect the signal. A 180 degree phase shift is then applied to the output clock 252, which may be implemented either by causing the second alignment logic 318 to invert the feedback clock 356, or by the output DLL (or PI) 308 applying the 180 degree phase shift to the intermediate clock 258. Thus, falling edges of the output clock 252 maintain an approximately fixed phase relationship to falling edges of the input clock 162. By maintaining a constant duty cycle, the rising edges of the output clock 252 also maintain an approximately fixed phase relationship to rising edges of the input clock 162 that is approximately the same as in the SDR/rising edge alignment mode. As a result, the SDR propagation delay measured between a rising edge of the input clock 162 and the change in output command/address data 250 (on a falling edge of the output clock) is maintained as tPDM-SDR.

In a DDR/falling edge alignment mode, the edge/mode control signals 248-1 control the first alignment logic 304 to invert the input clock 352 so that the DLL (or PI) 406 locks to the falling edge of the input clock 162. The second alignment logic 318 may select between using the rising edge or falling edge of the intermediate clock 258 as a feedback reference edge. If the second alignment logic 318 selects the falling edge of the intermediate clock 258, it inverts the feedback clock 356, which causes a 180 degree phase shift in the intermediate clock 258. The output DLL (or PI) 308 may be configured to apply an additional 180 degree phase shift to compensate. If the second alignment logic 318 selects the rising edge of the intermediate clock 258 as the reference feedback edge, the output DLL (or PI) 308 does not apply the 180 degree phase shift. Thus, the rising edges of the output clock 252 has an approximately fixed phase relationship to rising edges of the inverted input clock 354, or equivalently, the rising edges of the output clock 252 have an approximately fixed phase relationship to falling edges of the input clock 162, characterized by the propagation delay from the input clock 162 to the output clock 252. Changes in the output command/address data 250 are aligned to falling edges of the output clock 252, and the DDR propagation delay between falling edge of the input clock 162 and the change in output of the command/address data 250 (on a corresponding falling edge of the output clock 252) may be defined as tPDM-DDR.

Figure 4:
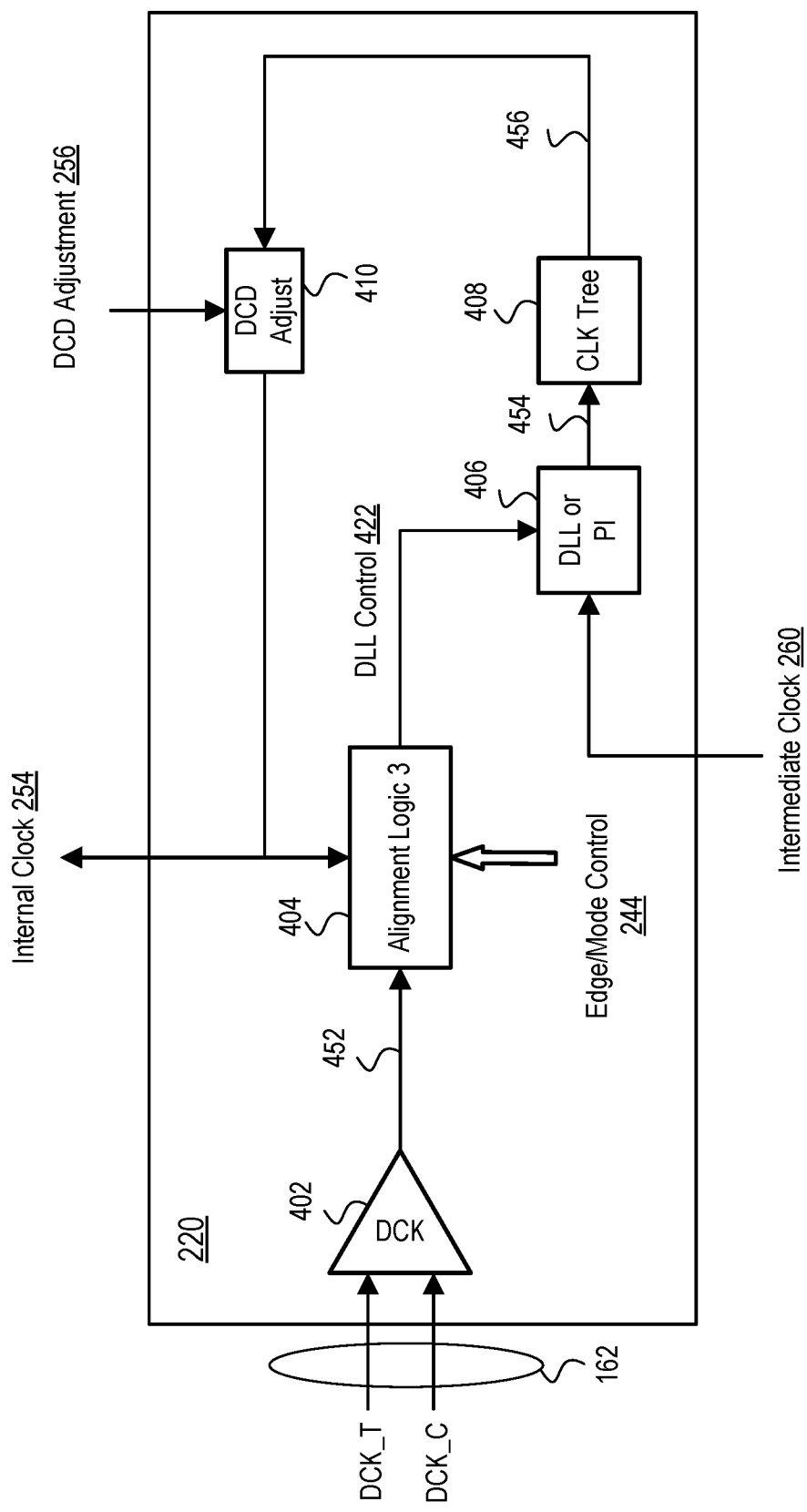
FIG. 4 is a block diagram illustrating an example embodiment of an internal clock generator circuit.

In a DDR/rising edge alignment mode, the edge/mode control signals 248 control the first alignment logic 304 to directly pass the input clock 352 without inverting it so that the DLL (or PI) 406 locks to the rising edges of the input clock 162. A 180 degree phase shift is then applied to the output clock 252, which may be implemented either by causing the second alignment logic 318 to invert the feedback clock 356, or by the output DLL (or PI) 308 applying the 180 degree phase shift to the intermediate clock 258. Thus, an approximately fixed phase relationship is maintained between rising edges of the input clock 162 and falling edges of the output clock 252, and this phase relationship is approximately the same as in the DDR/falling edge alignment mode. The DDR propagation delay between falling edge of the input clock 162 and the change in output of the command/address data 250 (on a corresponding falling edge of the output clock 252) is maintained as tPDM-DDR FIG. 4 is a block diagram illustrating an example embodiment of an internal clock generator circuit 220. A buffer 402 receives the input clock 162 as a differential clock signal (DCK_T, DCK_C) and generates a single-ended clock signal 452. A third alignment logic 404 obtains the single-ended clock signal 452, a version of the internal clock signal 254, and an edge/mode control signal 244 and generates a DLL (or PI) control signal 422 for controlling a parameter of a DLL (or PI) 406. The DLL (or PI) 406 generates an aligned clock signal 454 from the intermediate clock signal 260 based on the DLL (or PI) control signal 422. The third alignment logic 404 may determine a misalignment between the configured reference edges indicated by the edge/mode control signal 244 of the input clock 452 and the internal clock 254 and generate the DLL (or PI) control signal 422 to control the DLL (or PI) 406 to apply a phase shift to the intermediate clock signal 260 that compensates for the misalignment, so that the reference edges of the internal clock 254 are aligned to the reference edges of the input clock 162. Either edge of the internal clock 254 can be aligned with either edge of the input clock 452 depending on the edge/mode control signal 244.

The clock tree 408 buffers the aligned clock 454 to generate a buffered clock 456. The DCD adjust circuit 410 then adjusts a duty cycle of the buffered clock 456 based on the DCD adjustment control signal 256 generated by the duty cycle adjustment control circuit 230 described above. For example, the DCD adjust circuit 410 may adjust the buffered clock 456 to generate an internal clock 254 having an approximately 50% duty cycle or another duty cycle that tracks a duty cycle of the input clock 162. The internal clock signal 254 is provided as feedback to the alignment logic 404 and is used as a clock in the command/address sampler circuit 210 to sample the input command/address signals 158 as described above.

Figure 5A:
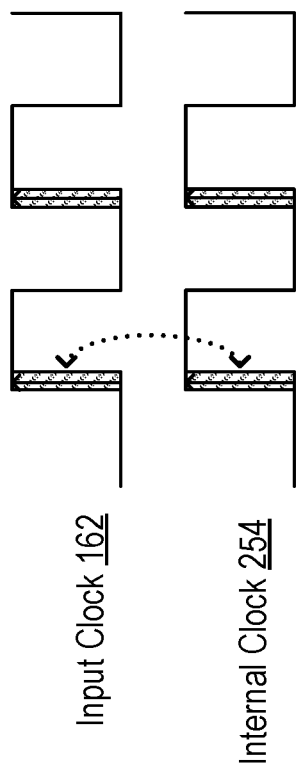
FIG. 5A illustrates waveforms including an example set of clock signals subjected to rising edge noise in which the internal clock is referenced to rising edges of an input clock.
Figure 5B:
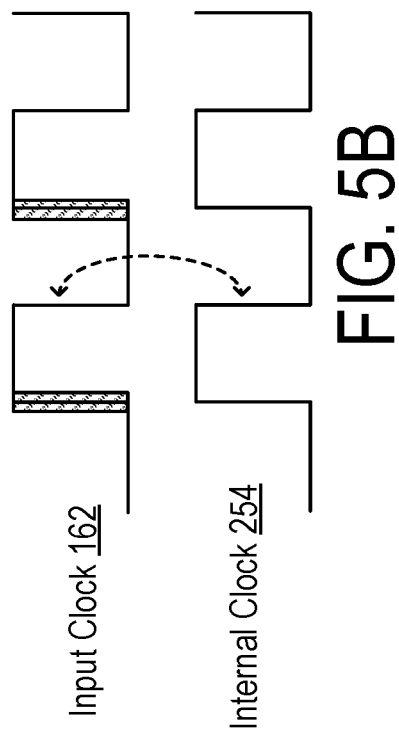
FIG. 5B illustrates waveforms including an example set of clock signals subjected to rising edge noise in which the internal clock is referenced to falling edges of an input clock.

FIGS. 5A-B illustrate example waveforms associated with generation of the internal clock 254 when the input clock 162 is noisy. In FIG. 5A, signal noise affects the rising edges of the input clock 162, thus introducing rising edge jitter. Configuring the internal clock 254 to reference its rising edges to the rising edges of the input clock 162 therefore may propagate the rising edge jitter to the internal clock 254. In FIG. 5B, the RCD 110 is instead configured to reference the falling edges of the internal clock 254 to the falling edges of the input clock 162. Because the falling edges in this example are not as noisy as the rising edges, the jitter in the internal clock 254 can be reduced by using a falling edge reference instead of a rising edge reference.

Figure 6A:
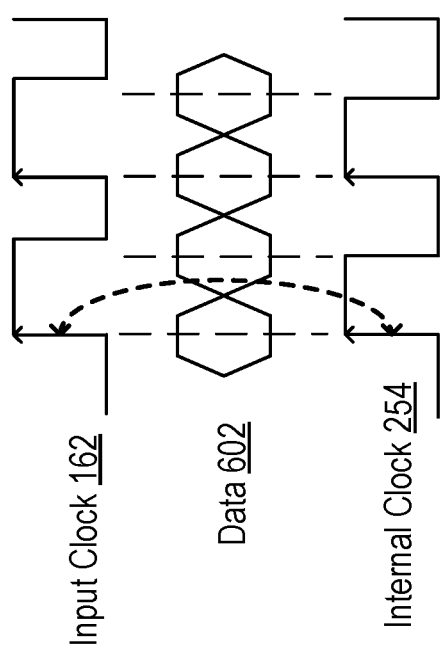
FIG. 6A illustrates waveforms including an input clock having duty cycle distortion noise in which the internal clock is referenced to rising edges of the input clock.
Figure 6B:
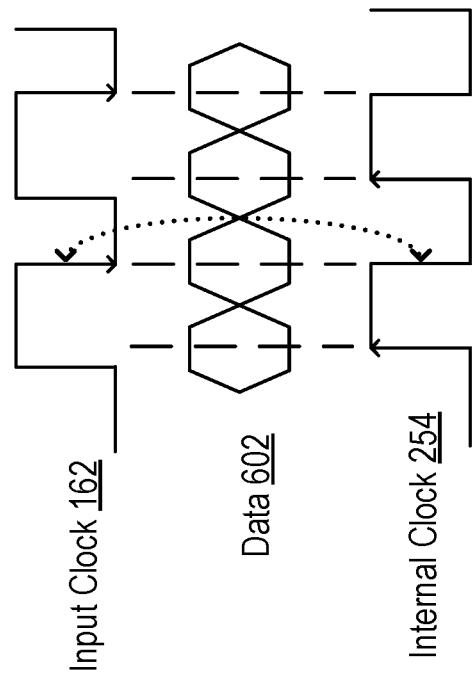
FIG. 6B illustrates waveforms including an input clock having duty cycle distortion noise in which the internal clock is referenced to falling edges of the input clock.

FIGS. 6A-B illustrate further example waveforms associated with generation of the internal clock 254 when the input clock 162 is noisy. In FIG. 6A, the RCD 110 operates in DDR mode and DCD is present in the input clock 162. In this example, the received data signal 602 is referenced to the rising edges of the input clock 162, but there may be misalignment between the data 602 and the falling edges due to the DCD. The RCD 110 may be configured to use the rising edges as the reference edges when generating the internal clock 254 and correct for the DCD, therefore resolving the misalignment. In FIG. 6B, the received data signal 602 is instead referenced to the falling edges of the input clock 162, but there may be misalignment between the data 602 and the rising edges due to the DCD. In this case, the RCD 110 may instead be configured to use the falling edges as the reference edges when generating the internal clock 254 and correct for the DCD, thereby resolving the misalignment.

Upon reading this disclosure, those of ordinary skill in the art will appreciate still alternative structural and functional designs and processes for the described embodiments, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A clock driver circuit comprising:
an internal clock generator circuit to receive an input clock from a source device, the input clock providing timing information associated with an input data signal, and the internal clock generator circuit to receive an internal clock control signal specifying a first selected reference edge of the input clock, and to generate an internal clock locked to the first selected reference edge of the input clock;
an output clock generator circuit to receive the input clock and an output clock control signal specifying a second selected reference edge of the input clock, and to generate an output clock locked to the second selected reference edge of the input clock, wherein the output clock has a predefined phase relationship to the input clock that is independent of the first and the second selected reference edges;
a sampling circuit to receive the input data signal from the source device and to sample the input data signal based on the internal clock to generate an output data signal; and
an output interface to output the output data signal and to output the output clock to a destination device, wherein the output clock provides timing information associated with the output data signal.

2. The clock driver circuit of claim 1, wherein the first and second selected reference edges each specify a rising edge of the input clock.

3. The clock driver circuit of claim 1, wherein the first and second selected reference edges each specify a falling edge of the input clock.

4. The clock driver circuit of claim 1, wherein the first selected reference edge specifies a rising edge of the input clock and wherein the second selected reference edge specifies a falling edge of the input clock.

5. The clock driver circuit of claim 1, wherein the first selected reference edge specifies a falling edge of the input clock and wherein the second selected reference edge specifies a rising edge of the input clock.

6. The clock driver circuit of claim 1, wherein the output clock generator circuit comprises:
first alignment logic to selectively invert the input clock dependent on the output clock control signal, the first alignment logic to generate a selectively inverted clock;
a loop circuit to compare a phase of the selectively inverted clock with a phase of a feedback clock, to adjust a phase of an intermediate clock based on a difference between the phase of the selectively inverted clock and the phase of the feedback clock, and to generate the feedback clock based on the intermediate clock; and
an output circuit to generate the output clock based on the intermediate clock.

7. The clock driver circuit of claim 6, wherein the output circuit comprises:
a phase shifter circuit to selectively apply a 180 degree phase shift to the intermediate clock based on a control signal to generate the output clock such that the phase relationship between the input clock and the output clock is maintained independent of the first and second selected reference edges.

8. The clock driver circuit of claim 6, wherein the loop circuit further comprises:
a second alignment circuit to selectively apply an inversion to the intermediate clock based on a control signal to generate the feedback clock such that the phase relationship between the input clock and the output clock is maintained independent of the first and second selected reference edges.

9. The clock driver circuit of claim 6, further comprising:
a duty cycle distortion adjustment control circuit to detect duty cycle distortion in the input clock and to generate a duty cycle adjustment control signal based on the detected duty cycle distortion; and
wherein the output clock generator circuit comprises a duty cycle adjustment circuit to adjust a duty cycle of the feedback clock to compensate for the detected duty cycle distortion.

10. The clock driver circuit of claim 6, wherein the loop circuit comprises:
third alignment logic to receive the input clock, the internal clock, and the internal clock control signal, and to generate a phase control signal based on an alignment of the first selected reference edges of the input clock to corresponding edges of the internal clock; and
a clock generator circuit to receive the intermediate clock and to adjust a phase of the intermediate clock based on the phase control signal to generate the internal clock.

11. The clock driver circuit of claim 10, further comprising:
a duty cycle distortion adjustment control circuit to detect duty cycle distortion in the input clock and to generate a duty cycle adjustment control signal based on the detected duty cycle distortion; and
wherein the loop circuit comprises a duty cycle adjustment circuit to adjust a duty cycle of the internal clock to compensate for the detected duty cycle distortion.

12. A method for operating a buffer circuit comprising:
receiving, by an internal clock generator circuit, an input clock from a source device, the input clock providing timing information associated with an input data signal, and receiving by the internal clock generator circuit, an internal clock control signal specifying a first selected reference edge of the input clock;
generating, by the internal clock generator circuit, an internal clock locked to the first selected reference edge of the input clock;
receiving, by an output clock generator circuit, the input clock and an output clock control signal specifying a second selected reference edge of the input clock;
generating, by the output clock generator circuit, an output clock locked to the second selected reference edge of the input clock, wherein the output clock has a predefined phase relationship to the input clock that is independent of the first and the second selected reference edges;
receiving, by a sampler circuit, the input data signal from the source device;
sampling, by the sampler circuit, the input data signal based on the internal clock to generate an output data signal; and
outputting, by an output interface, the output data signal with the output clock to a destination device, wherein the output clock provides timing information associated with the output data signal.

13. The method of claim 12, wherein the first and second selected reference edges each specify a rising edge of the input clock.

14. The method of claim 12, wherein the first and second selected reference edges each specify a falling edge of the input clock.

15. The method of claim 12, wherein the first selected reference edge specifies a rising edge of the input clock and wherein the second selected reference edge specifies a falling edge of the input clock.

16. The method of claim 12, wherein the first selected reference edge specifies a falling edge of the input clock and wherein the second selected reference edge specifies a rising edge of the input clock.

17. The method of claim 12, wherein generating the output clock comprises:
- selectively inverting the input clock dependent on the output clock control signal to generate a selectively inverted clock;
- comparing, by a loop circuit, a phase of the selectively inverted clock with a phase of a feedback clock;
- adjusting, by the loop circuit, a phase of an intermediate clock based on a difference between the phase of the selectively inverted clock and the phase of the feedback clock;
- generating, by the loop circuit, the feedback clock based on the intermediate clock; and
- generating, by an output circuit, the output clock based on the intermediate clock.

18. The method of claim 17, wherein generating the output clock comprises:
- selectively applying, by a phase shifter, a 180 degree phase shift to the intermediate clock based on a control signal to generate the output clock such that the phase relationship between the input clock and the output clock is maintained independent of the first and second selected reference edges.

19. A memory module comprising:
- a memory device;
- a data interface to receive write data for writing to the memory device in a write operation or read data read from the memory device in a read operation;
- a command/address interface to receive an input data signal from a source device comprising command and address data associated with the read and write operations of the memory device;
- a clock interface to receive an input clock from the source device, the input clock providing timing information associated with the input data signal;
- a buffer circuit comprising:
  - an internal clock generator circuit to receive the input clock and an internal clock control specifying a first selected reference edge of the input clock, and to generate an internal clock signal locked to the first selected reference edge of the input clock;
  - an output clock generator circuit to receive the input clock and an output clock control signal specifying a second selected reference edge of the input clock, and to generate an output clock locked to the second selected reference edge of the input clock, wherein the output clock has a predefined phase relationship to the input clock that is independent of the first and the second selected reference edges;
- a sampling circuit to receive the input data signal and to sample the input data signal based on the internal clock to generate an output data signal; and an output interface to output the output data signal and to output the output clock to the memory device to carry out the read operation or the write operation, wherein the output clock provides timing information associated with the output data signal.

20. The memory module of claim 19, wherein the output clock generator circuit comprises:
- first alignment logic to selectively invert the input clock dependent on the output clock control signal, the first alignment logic to generate a selectively inverted clock;
- a loop circuit to compare a phase of the selectively inverted clock with a phase of a feedback clock, to adjust a phase of an intermediate clock based on a difference between the phase of the selectively inverted clock and the phase of the feedback clock, and to generate the feedback clock based on the intermediate clock; and
- an output circuit to generate the output clock based on the intermediate clock.

* * * * *